(12) United States Patent
Sasaki

(10) Patent No.: US 6,482,472 B2
(45) Date of Patent: Nov. 19, 2002

(54) METHOD FOR PRODUCING A PHOTOPOLYMERIZING LITHOGRAPHIC PLATE INCLUDING COATING AND CONVEYING A WEB USING RUBBER ROLLERS BEFORE AND AFTER THE COATING STEP

(75) Inventor: Hidehito Sasaki, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/413,852

(22) Filed: Oct. 7, 1999

(65) Prior Publication Data

US 2001/0003011 A1 Jun. 7, 2001

(30) Foreign Application Priority Data

Oct. 13, 1998 (JP) .......................... 10-290680

(51) Int. Cl.[7] ................................. B05D 3/12
(52) U.S. Cl. .................. 427/359; 427/444; 430/302
(58) Field of Search .................. 427/444, 359, 427/388.1, 388.5; 430/302

(56) References Cited

U.S. PATENT DOCUMENTS

| | | | |
|---|---|---|---|
| 4,779,356 A | | 10/1988 | Hehn .......................... 34/114 |
| 4,845,008 A | * | 7/1989 | Nishioka et al. ............ 430/165 |
| 5,583,600 A | * | 12/1996 | Kurosawa et al. .......... 396/622 |
| 5,887,214 A | * | 3/1999 | Kuriu et al. ................. 396/608 |

FOREIGN PATENT DOCUMENTS

| | | | |
|---|---|---|---|
| EP | 835 764 A1 | * 4/1988 | |
| JP | 58-4589 | 1/1983 | ............ B05D/1/28 |
| JP | 59-123568 | 7/1984 | ............ B05D/1/26 |
| JP | 62-251739 | 11/1987 | ............ G03C/1/00 |
| JP | 1-57629 | 12/1989 | ............ B05C/5/02 |
| JP | 4-244265 | 9/1992 | ............ B05D/1/28 |
| JP | 6-1510 | * 1/1994 | |
| JP | 6-144667 | 5/1994 | ............ B65I/27/00 |
| JP | 10-128215 | 5/1998 | ............ B05C/11/08 |
| JP | 10-161317 | 6/1998 | ............ G03F/7/11 |

OTHER PUBLICATIONS

Patent Abstracts of Japan, vol. 1997, No. 04, Apr. 30, 1997 (JP 08–323897).
Patent Abstracts of Japan, vol. 1997, No. 10, Oct. 31, 1997 (JP 09–160369).
Handbook of Chemicals for Rubber and Plastic Formations revised second edition, Yoshimichi Mitsumori, "Handbook" editorial room, Rubber Digest Co., Ltd., pp. 76–121 (no date).

* cited by examiner

Primary Examiner—Katherine A. Bareford
(74) Attorney, Agent, or Firm—Sughrue Mion, PLLC

(57) ABSTRACT

Decrease in sensitivity can be avoided to obtain a stable and highly sensitized photosensitive layer in a process for preparing a photopolymerizing lithographic plate including a coating step and using rubber rollers before and after the coating site. This is achieved by excluding an antioxidant and/or aging retardant from at least the surface of rubber rollers placed before and after the coating site. The photopolymerizing lithographic plate excellent in its sensitivity as compared with the conventional one can be obtained.

11 Claims, 1 Drawing Sheet

METHOD FOR PRODUCING A PHOTOPOLYMERIZING LITHOGRAPHIC PLATE INCLUDING COATING AND CONVEYING A WEB USING RUBBER ROLLERS BEFORE AND AFTER THE COATING STEP

FIELD OF THE INVENTION

The present invention relates to a novel process and apparatus for preparing a photopolymerizing lithographic plate, more particularly to an improvement in a process for preparing a photosensitive lithographic plate which realizes preventing a photosensitive layer thereof from lowering its sensitivity. The present invention is also directed to a photopolymerizing lithographic plate produced by this process.

BACKGROUND OF THE INVENTION

A photopolymerizing lithographic plate is known in the art. Various processes for preparing same have been proposed until now. For example, the invention disclosed in JP-A-10-161317/1998 (the term "JP-A" as used herein means an "unexamined Japanese Patent Kokai Publication") enables to provide a negative imaging lithographic plate capable of direct plate making. A photopolimerizable composition is employed in this lithographic plate. The lithographic plate is highly sensitive to a laser beam especially in the region of visible light and excellent in printing properties such as tone reproducibility, resistance to printing, adhesion of dirt and the like.

SUMMARY OF THE DISCLOSURE

However, the following problems have been encountered in the course of investigations toward the present invention. Namely, a more highly sensitizing lithographic plate capable of direct plate making is an everlasting theme. Accordingly, the development of a more highly photosensitive photopolymerizing lithographic plate is required now.

Accordingly it is an object of the present invention to provide an improvement in a process and/or apparatus for preparing a photopolymerizing lithographic plate comprising a coating step and using rubber rollers before and after the coating step. In more detail, the present invention aims at developing a process for preparing a photopolymerizing lithographic plate having a more highly sensitized photosensitive layer.

It is a further object of the present invention to provide an improved photopolymerizing lithographic plate.

The present inventors studied assiduously to improve the process for preparing a photopolymerizing lithographic plate in order to improve the photosensitive layer of the photopolymerizing lithographic plate in terms of sensitivity. Consequently, it was found that the sensitivity is lowered based on an antioxidant (including an aging retardant). This antioxidant contained in a rubber roller is usually used and transferred to the photopolymerizing photosensitive layer to be used. The antioxidant exerts a polymerization inhibition effect upon using the rubber roller in contact with a substrate on a web for handling the substrate for a prolonged period of time or at high temperatures. This can be observed in a process for preparing the lithographic plate including a step of coating continuously the photosensitive layer on the substrate, preferably an aluminum substrate. Then, it was found that lowering the 'sensitivity is prevented and the photosensitive layer having a stable and high sensitivity is obtained by employing a rubber roller or rollers on the surface of which no antioxidant substantially exists. The present invention has been completed on the basis of these findings.

Accordingly, in one aspect of the present invention there is provided a process, for preparing a photopolymerizing lithographic plate comprising a step of coating, in which rubber rollers are used for carrying/conveying a web before and after the coating step. The surface of the rubber rollers to be used at least just before and after the coating step contains substantially no antioxidant and/or aging retardant. Thereby, substantially no antioxidant and/or aging retardant is transferred to a photosensitive layer laminated on a substrate on the web upon using the rubber rollers for a prolonged period of time or at high temperatures.

The rubber rollers exist at least before and after the coating step at a coating site. According to the present invention, it is only required that a surface of at least one rubber roller each positioned just before and after the coating place does not contain the antioxidant and/or aging retardant. It is preferred that the rubber rollers containing the coating surface should satisfy this requirement. In another aspect there is provided an improved product obtainable by the process of the present invention, as well as an apparatus for producing a photopolymerizing lithographic plate in a further aspect.

Other features and aspects of the present invention will become apparent from the entire disclosure, particularly from the appended claims which are incorporated herein by reference thereto.

PREFERRED EMBODIMENTS OF THE INVENTION

The present invention also includes following embodiments.
1. The above process in which the rubber roller is a roller whose surface is coated with rubber.

Kinds and shapes of the rubber roller are not limited except it can convey a substrate thereon. For example, such rollers whose surface are coated or covered with rubber as a "roller for conveying a web" (cf. JP-A-6-144667/1994) are frequently used. These rollers can be reused by changing a wasted coating/cover of rubber with new one. The description concerning the rubber roller found in the JP-A-6-144667/1994 is incorporated herein by reference.
2. The above process in which the substrate is an aluminum substrate.
3. The above process in which the rubber constituting at least the surface of the rubber roller is selected from at least one of ethylene-propylene and urethane rubbers.

As a rubber roller used in the present invention, rubber rollers which are generally in use can be employed. The rubber material used at least on the surface of the roller may be rubber for use in various rollers. Preferably, a rubber roller for carrying/conveying a web can be applied. Ethylene-propylene and urethane rubbers are preferable in view of avoiding decrease in the sensitivity.
4. The above process in which the antioxidant is at least one compound included in phenol, amine and phosphorous series of antioxidants.

According to the present invention, the rubber on the surface of the roller does not substantially contain an antioxidant and/or aging retardant. These agents includes antioxidants and aging retardant which are in general use. Examples of these agents are disclosed in "Handbook of Chemicals for Rubber and Plastic Formulations" (revised second edition, Yoshimichi Mitsumori, "Handbook" editorial room, Rubber Digest Co. Ltd., 5. Aging Retardant, Antioxidant and Antiozonant, p. 76 to 121). Of course, the description of these agents disclosed in this document is incorporated herein by reference.

Concrete examples of these agents include a) naphthylamines such as phenyl-α-naphthylamine and the like, b) diphenylamines such as p-(p-toluenesulfonylamide)-diphenylamine, c) p-phenylenediamines such as N,N'-diphenyl-p-phenylenediamine, d) other amines such as condensation product of aromatic amine and alophatic ketone and the like, e) mixtures of amines such as mixture of phenyl-α-naphthylamine with diphenyl-p-phenylenediamine and the like, f) quinolines such as polymer of 2,2,4-trimethyl-1,2-dihydroquinoline and the like, g) hydroquinone derivatives such as 2,5-di-(tert-amyl)-hydroquinone, h) mono-phenoles such as 1-oxy-3-methyl-4-isopropylbenzene, i) bis-, tris- and poly-phenols such as 2,2'-methylene-bis-(4-methyl-6-tert-butylphenol), j) thio-bisphenols such as 4,4'-thiobis-(6-tert-butyl-3-methylphenol) and the like, k) hindered phenols such as 1,1,3-tris-(2-methyl-4-hydroxy-5-tert-butylphenyl) butane, l) phosphites (esters) such as tris(nonylphenyl)phosphite and the like, m) other aging retardants such as dilauryl thiodipropionate and the like, n) coppering retardants and metal-deactivating agents such as 1,2,3-benzothiazole and the like and o) waxes such as specialty wax and the like.

It is preferable from an aspect of the effect on avoiding the decrease in the sensitivity that the rubber does not contain antioxidants (also aging retardant), especially, phenol, amine and phosphorous series of compounds among them.

Concerning the usage of antioxidant and/or aging retardant, no use is recommended because it is the best way. Usual usage of these agents, which is effective for improving rubber characteristics such as resistance to oxidation, aging property and the like, ranges, for example, from 0.1 to 10% by weight, preferably, from 0.5 to 5% by weight. However, these degree of the usage causes adverse effects. Accordingly, it is involved in the process of the present invention to use the agent in a slight amount to such an extent that these effects do not appear, or it is substantially not transferred to the photosensitive layer laminated on the substrate to be carried/conveyed.

5. A photopolymerizing lithographic plate produced by the above process.

DETAILED DESCRIPTION OF THE PREFERRED EMBODIMENTS

Figure 1:
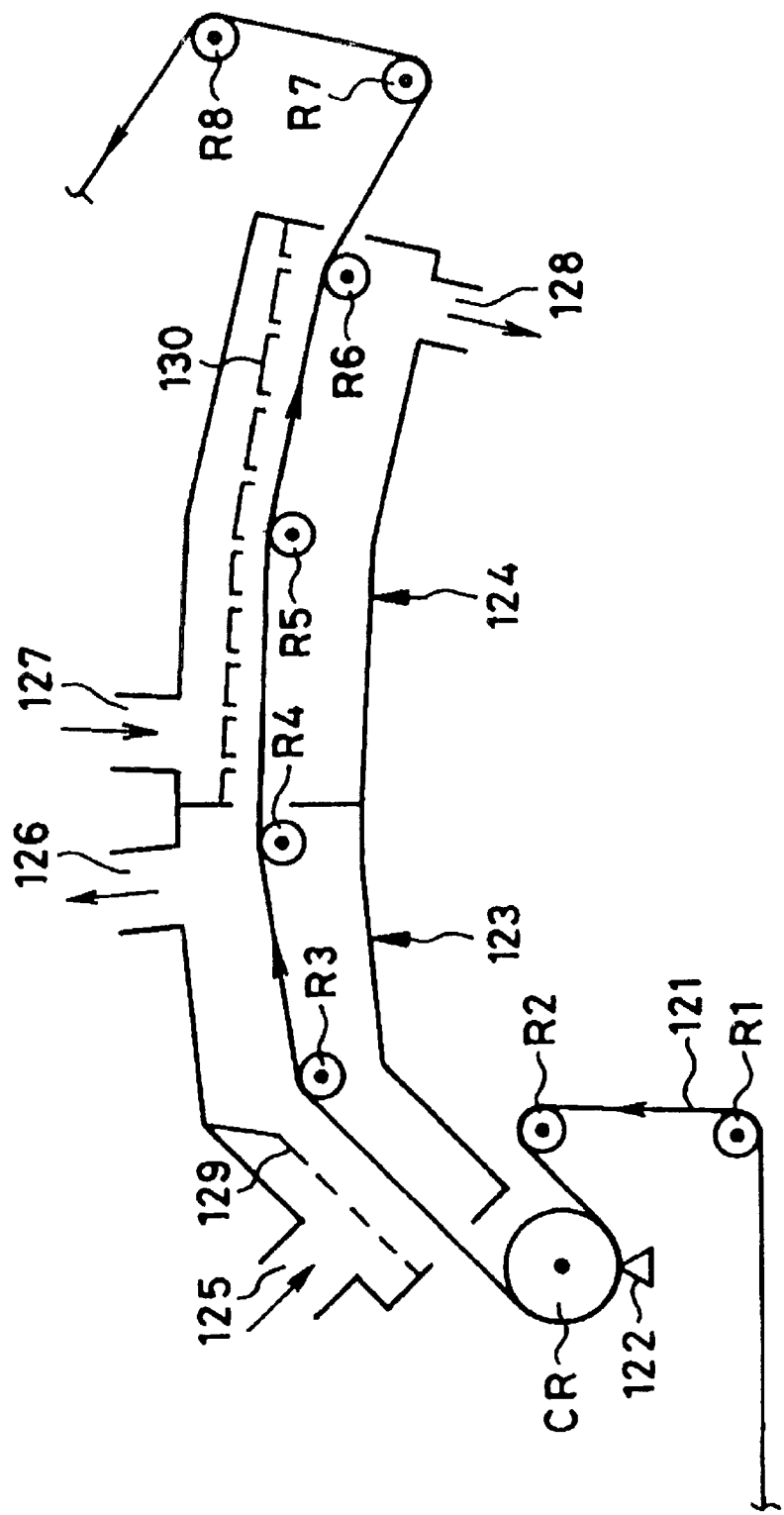
FIG. 1 is a schematic cross sectional view of an exemplary drying apparatus placed after a coating site and shows the position of rubber rollers used in the present invention relative to the drying apparatus.

Next, preferred embodiments of the present invention will be explained as follows.

In the process for preparing a photopolymerizing lithographic plate of the present invention, the rubber composition on the surface of a rubber roller to be used has the above described features. Except these features, any process, for preparing a potopolymerizing lithographic plate, which is known or will be developed in the future, can be utilized as effectively as possible.

Accordingly, as to the step of coating a photosensitive composition on a substrate of aluminum and the like, known coating steps and processes can be applied which are disclosed in, for example, JP-A-62-251739/1987, JP-B-58-4589/1983, JP-A-59-123568/1984, JP-A-4-244265/1992, JP-B-1-57629/1989 and JP-A-10-128215/1998 (the term "JP-A" as used herein means an "unexamined Japanese Patent Kokai Publication" and the term "JP-B" as used herein means an "examined Japanese Patent Kokoku Publication"). Of course, any coating process and the like which will be developed in the future can be employed also.

Before and after the coating step (or site), especially, just before and after the same, rubber rollers whose surface does not contain any antioxidant or aging retardant are used in the present invention.

FIG. 1 is a schematic cross sectional view showing one embodiment of a drying apparatus. An exemplary arrangement of the rubber rollers used in this invention will be explained relative to the position of a drying apparatus.

A long aluminum web 121 running continuously guided by rubber guide rollers R1 to R8 is coated with a coating solution containing a solvent at a coating site (or point) 122, introduced into first and second step drying zones 123, 124 and dried therein. The coating site 122 is disposed on the outer circumference of a back up roll CR around which the web 121 rotates to run. The back up roll has a metallic surface of hard chrome plating.

The first drying zone has a chamber with an air supply vent 125, flow-adjusting plate 129 and an exhaust vent 126, and two rollers R3 and R4 therein. The second drying zone 124 has a chamber with an air supply vent 127, slit nozzles 130 and an exhaust vent 128, and also two rollers R5 and R6. Additional two deflecting rollers R7 and R8 which contact the coated surface are disposed outside the second drying zone 124 downstream thereof. Two deflecting guide rollers R1 and R2 contacting the surface to be coated are disposed upstream of the coating site 122. The back up roll CR around which the web runs through about 180 degrees has a large diameter and is disposed at the coating site, just preceding the first drying zone 123.

Here, it is necessary that the surface of the rubber roller R2 which is arranged just before the coating site does not substantially contain an antioxidant or aging retardant. And, it is preferable that no antioxidant nor aging retardant is substantially contained in the surface of the rubber roller R1 which is positioned before the rubber roller R2 and other rubber rollers if placed before (upstream) the rubber roller R1.

On the other hand, it is recommended to exclude materially an antioxidant or an aging retardant from the surface of the rubber rollers R3 to R6 positioned after (downstream) the coating site. Among them the rubber roller R3 is arranged just after the coating site. It is also recommended not to substantially contain any antioxidant or aging retardant especially on the surface of the rubber rollers R7 and R8 which are to be in contact with the coating.

According to the present invention, compounds, which are referred to "antioxidant and aging retardant" and substantially excluded from the rubber composition constituting the surface of the rubber roller, mean those which function as a polymerization inhibitor in the course of photopolymerization proceeded in the photosensitive layer. Accordingly, any antioxidant and aging retardant developed in the future, if there is such a function, are also included in the "antioxidant and aging retardant" which are substantially not used in the present invention. In contrast with this, any antioxidant or aging retardant which does not exhibit such a function is not involved in these agents ("antioxidant or aging retardant") concerned of the present invention.

EXAMPLES

The present invention will be explained more in detail by the following examples and comparative examples.

Example 1

Immediately after coating, the surface of a coated photosensitive layer was brought into contact with a roller whose surface had been covered with a sample rubber shown in the following Table 1. Then, the G/S sensitivity of the photosensitive layer was measured.

Measurement of the G/S Sensitivity

A gray scale (G/S) was attached to a printing plate. A fixed intensity of light was exposed from the upside thereof. In developing, a developer solution sold under the name of DP-4 by Fuji Photo Film Co., Ltd. was used after diluting to $1/18$ with water followed by preliminary developing of 10 m² of the exemplified printing plate by using 1 liter of the diluted developer. The development of the light-exposed printing plate was carried out by using an automatic developing machine 850NX® manufactured by Fuji Photo Film Co., Ltd. and immersing it in the developer solution at 30° C. for 15 sec. Here, the "G/S sensitivity" means a distinguishable number of steps (grades) observed at an image portion formed, distinguishably from the non-image portion, on the developed printing plate after exposing to light through the G/S. The light transmittance through the G/S is varied stepwise. Thereby, the exposed light on the printing plate is also changed stepwise. High number of the steps indicates the possibility of imaging through low intensity of light exposure, i.e., high sensitivity.

The results are shown in Table 1.

TABLE 1

| Name of rubber sample piece | Rubber material | Content of antioxidant on the surface of rubber | G/S sensitivity | Judgement |
|---|---|---|---|---|
| CR roller | Polychloroprene | contained | 11.5 | x |
| RunWell B | Butadiene-acrylonitrile coplymer | contained | 9 | x |
| Fortem I | Same with the above | contained | 11.5 | x |
| Fortem II | Same with the above | contained | 11.5 | x |
| Fortem III | Same with the above | none | 12 | o |
| Urethane | polyurethane | none | 13 | o |
| Abress*¹ | unknown | none | 12.5 | o |
| EPDM | ethylene-propylene copolymer | none | 12.5 | o |
| None | | | 12.5 | |

*¹manufactured by Kinyo Co., Ltd.

As is evident from the results of Table 1, it was found that the rubber roller whose surface of rubber composition contains no antioxidant is especially excellent in terms of the G/S sensitivity.

Some of the meritorious effects of the invention are summarized below.

The present invention provides a process for preparing a photopolymerizing lithographic plate including a coating step and using rubber rollers before and after the coating step. The roller whose rubber surface does not substantially contain antioxidant and/or aging retardant is employed in the present invention so as not to transfer the antioxidant or aging retardant to a photosensitive layer laminated on a substrate of the plate. Thereby, the decrease in the sensitivity of the photosensitive layer is avoided and stable and high sensitivity can be obtained.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A process for preparing a photopolymerizing lithographic plate comprising:
   (a) providing a web and rubber rollers to convey the web,
   (b) coating a photosensitive layer on a substrate on a web and conveying the web,
   wherein the conveying is carried out by using rubber rollers to convey the web before and after the coating step, and
   (c) substantially eliminating transfer of an antioxidant to a photosensitive layer laminated on the substrate on said web upon being conveyed on said rubber rollers, a surface of which to be used at least before and after said coating step does not substantially contain antioxidant.

2. The process as defined in claim 1, wherein said rubber rollers are rollers whose surfaces are coated with rubber.

3. The process as defined in claim 1, wherein said substrate is an aluminum substrate.

4. The process as defined in claim 1, wherein the rubber constituting at least the surface of said rubber rollers is selected from at least one of ethylene-propylene rubber and urethane rubber.

5. The process as defined in claim 1, wherein said antioxidant is at least one compound selected from phenol, amine and phosphorous series of antioxidants.

6. The process as defined in claim 1, wherein a surface of a back up rubber roller at the coating step does not substantially contain antioxidant.

7. The process as defined in claim 1, wherein one or more rubber rollers disposed upstream of said rubber roller just before said coating step do not substantially contain antioxidant.

8. The process as defined in claim 1, wherein one or more rubber rollers disposed downstream of said rubber roller just after said coating step do not substantially contain antioxidant.

9. The process as defined in claim 1, wherein said rubber rollers comprise those contacting a coating surface of said substrate.

10. The process as defined in claim 1, wherein the rubber constituting at least the surface of said rubber rollers is urethane rubber.

11. A process for preparing a photopolymerizing lithographic plate comprising:
   (a) providing a web,
   (b) providing rubber rollers for conveying the web,
   (c) coating a photosensitive layer on a substrate on a web,
   wherein the conveying is carried out by using said rubber rollers, disposed at least just before and after said coating step, whose surface does not substantially contain an antioxidant, and
   (d) substantially eliminating transfer of an antioxidant to a photosensitive layer coated on the substrate on said web upon contacting said surface of said rubber rollers with said substrate and said photosensitive layer before and after the coating step, respectively.

* * * * *